United States Patent
Kansaku

(10) Patent No.: US 10,128,149 B2
(45) Date of Patent: Nov. 13, 2018

(54) SEMICONDUCTOR DEVICE AND METHOD FOR MANUFACTURING SAME

(71) Applicant: PS4 Luxco S.a.r.l., Luxembourg (LU)

(72) Inventor: Takashi Kansaku, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 178 days.

(21) Appl. No.: 14/762,595

(22) PCT Filed: Jan. 23, 2014

(86) PCT No.: PCT/JP2014/051329
§ 371 (c)(1),
(2) Date: Jul. 22, 2015

(87) PCT Pub. No.: WO2014/115790
PCT Pub. Date: Jul. 31, 2014

(65) Prior Publication Data
US 2015/0364427 A1  Dec. 17, 2015

(30) Foreign Application Priority Data
Jan. 24, 2013 (JP) ................................ 2013-010877

(51) Int. Cl.
*H01L 21/768* (2006.01)
*H01L 23/532* (2006.01)
(Continued)

(52) U.S. Cl.
CPC .. *H01L 21/76846* (2013.01); *H01L 21/02186* (2013.01); *H01L 21/02244* (2013.01);
(Continued)

(58) Field of Classification Search
CPC ......... H01L 21/76846; H01L 21/76855; H01L 23/53223
See application file for complete search history.

(56) References Cited

U.S. PATENT DOCUMENTS

| | | | |
|---|---|---|---|
| 6,274,487 B1 * | 8/2001 | Suzuki | H01L 21/76843 257/E21.584 |
| 2003/0020165 A1 * | 1/2003 | Matsumoto | H01L 21/76846 257/751 |

(Continued)

FOREIGN PATENT DOCUMENTS

| JP | 63009954 | 1/1988 |
|---|---|---|
| JP | 08055837 | 2/1996 |

(Continued)

OTHER PUBLICATIONS

Application No. PCT/JP2014/051329, International Search Report, Apr. 28, 2014.

*Primary Examiner* — Mark Tornow
*Assistant Examiner* — Abbigale Boyle
(74) *Attorney, Agent, or Firm* — Kunzler, PC

(57) ABSTRACT

Provided is a highly reliable semiconductor device and a method for manufacturing same. The method for manufacturing the semiconductor device includes forming an interlayer insulating film on a semiconductor substrate, forming a conductive plug in the interlayer insulating film, the conductive plug having a top surface for forming the same plane as the top surface of the interlayer insulating film, forming a first titanium film on the interlayer insulating film and the conductive plug, forming an aluminum diffusion-preventing film on the first titanium film, forming a second titanium film on the aluminum diffusion-preventing film, forming an aluminum film on the second titanium film, and shaping the area from the aluminum film to the first titanium film by etching to form wiring.

20 Claims, 13 Drawing Sheets

(51) Int. Cl.
*H01L 23/522* (2006.01)
*H01L 21/02* (2006.01)
*H01L 21/285* (2006.01)
*H01L 21/3105* (2006.01)
*H01L 23/528* (2006.01)
*H01L 21/3213* (2006.01)

(52) U.S. Cl.
CPC .... *H01L 21/2855* (2013.01); *H01L 21/28568* (2013.01); *H01L 21/31051* (2013.01); *H01L 21/32139* (2013.01); *H01L 21/76802* (2013.01); *H01L 21/76855* (2013.01); *H01L 21/76856* (2013.01); *H01L 21/76858* (2013.01); *H01L 21/76877* (2013.01); *H01L 21/76885* (2013.01); *H01L 23/528* (2013.01); *H01L 23/5226* (2013.01); *H01L 23/53223* (2013.01); *H01L 23/53257* (2013.01); *H01L 21/76805* (2013.01); *H01L 2924/0002* (2013.01)

(56) References Cited

U.S. PATENT DOCUMENTS

2004/0092130 A1* 5/2004 Usami ................ H01L 21/2855
 438/758
2011/0269308 A1* 11/2011 Kansaku ........... H01L 21/76846
 438/653

FOREIGN PATENT DOCUMENTS

JP 2000306999 11/2000
JP 2003332338 11/2003

\* cited by examiner

SEMICONDUCTOR DEVICE AND METHOD FOR MANUFACTURING SAME

TECHNICAL FIELD

Notice Regarding Related Application

The present invention is based upon the priority claim of Japanese patent application No. 2013-010877 (filed on Jan. 24, 2013), the disclosure of which is incorporated herein in its entirety by reference thereto.

The present invention relates to a semiconductor device provided with wiring lines comprising aluminum, and a method for manufacturing the same.

BACKGROUND ART

Aluminum (Al) or copper (Cu) are used as the wiring line material in semiconductor devices.

Patent literature article 1 discloses a semiconductor device in which Cu is used as the wiring line material. The copper wiring lines described in patent literature article 1 are formed by forming a groove in an interlayer insulating film, and embedding copper into the groove with the interposition of a barrier film.

Patent literature article 2 discloses a semiconductor integrated circuit device in which aluminum is used as the wiring line material. Wiring line layers described in patent literature article 2 comprise, besides an aluminum film, a titanium nitride (TiN)/titanium (Ti) film below the aluminum film (see, for example, FIG. 8 of patent literature article 2).

PATENT LITERATURE

Patent literature article 1: Japanese Patent Kokai 2000-277520

Patent literature article 2: Japanese Patent Kokai 1997-36229

SUMMARY OF THE INVENTION

Problems to be Resolved by the Invention

It should be noted that the disclosures in each of the abovementioned patent literature articles are incorporated herein in their entirety by reference. The following analysis is provided from the viewpoint of the present invention.

As semiconductor devices have become smaller, wiring lines have also become finer. Accordingly, there is a need for a technique to form highly-reliable fine wiring lines at low cost.

It is relatively straightforward to form narrow grooves in an interlayer insulating film. It is also straightforward to embed Cu into these grooves using plating techniques. It is therefore possible to form fine copper wiring lines by employing a copper wiring line technique such as that described in patent literature article 1. However, additional investment in plant and equipment is required in order to adopt such a copper wiring line technique. It is therefore not possible to fabricate fine wiring lines at low cost. In this case it is desirable to fabricate fine aluminum wiring lines.

Here, a process for fabricating an aluminum wiring line according to the background art such as that described in patent literature article 2 will be described. FIG. 22 is a schematic cross-sectional view of a process to form an aluminum wiring line according to the background art. In the process illustrated in FIG. 22, a tungsten (W) contact plug 903 underlaid with a barrier film 902 comprising titanium nitride/titanium is formed in an interlayer insulating film 901. A titanium film 904 and a titanium nitride film 905 are laminated onto the interlayer insulating film 901 as barrier films. An aluminum film 906 and a titanium nitride film 907 are then laminated. A mask 908 is then formed on the laminated body. The laminated body is then etched, using the mask 908 as a mask, to form aluminum wiring lines 910. At this time, if the width of the aluminum wiring line 910 is less than 150 nm, then side etches 911 are generated, as illustrated in FIG. 22, causing the aluminum film 906 to become tapered in a downward direction. The side etches 911 are caused because deposits that have become attached to the sidewalls of the aluminum film 906 during etching of the titanium nitride film 907 peel off, and etching of the aluminum film also progresses in the lateral direction at the instant the deposits are completely removed. The side etches 911 provoke peeling and collapse of the aluminum film 906, giving rise to a reduction in the product yield.

Means of Overcoming the Problems

According to a first aspect of the present invention, there is provided a method of manufacturing a semiconductor device, comprising: a step of forming an interlayer insulating film above a semiconductor substrate; a step of forming in the interlayer insulating film an electrically conductive plug, the upper surface of which forms the same plane as the upper surface of the interlayer insulating film; a step of forming a first titanium film on the interlayer insulating film and the electrically conductive plug; a step of forming an aluminum diffusion-preventing film on the first titanium film; a step of forming a second titanium film on the aluminum diffusion-preventing film; a step of forming an aluminum film on the second titanium film; and a step of forming a wiring line by employing etching to shape the films from the aluminum film to the first titanium film.

According to a second aspect of the present invention, there is provided a semiconductor device provided with: a semiconductor substrate; an interlayer insulating film formed above the semiconductor substrate; an electrically conductive plug which is formed in the interlayer insulating film, and the upper surface of which forms the same plane as the upper surface of the interlayer insulating film; and, on the interlayer insulating film, a wiring line which is electrically connected to the electrically conductive plug. The wiring line comprises: a titanium film in contact with the electrically conductive plug; an aluminum diffusion-preventing film formed on the titanium film; an aluminum alloy film formed on the aluminum diffusion-preventing film; and an aluminum film formed on the aluminum alloy film.

MODES OF EMBODYING THE INVENTION

Figure 1:
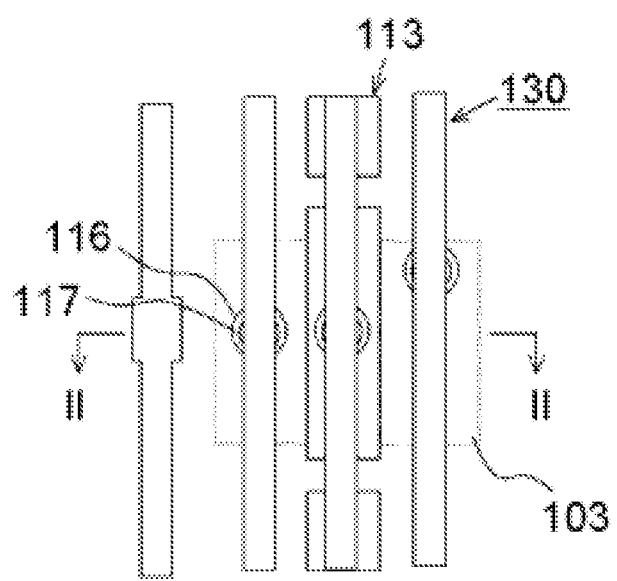
FIG. 1 is a schematic plan view of a semiconductor device according to a first mode of embodiment.

Preferred modes of the abovementioned aspects will now be described.

According to a preferred mode of the first aspect, the method of manufacturing a semiconductor device additionally comprises, before the step of forming the wiring line, a step of forming an aluminum alloy film by causing at least a portion of the second titanium film to react with a portion of the aluminum film.

According to a preferred mode of the first aspect, in the step of forming the aluminum alloy film, the aluminum alloy film is formed by heating the semiconductor substrate to 400° C. to 450° C.

According to a preferred mode of the first aspect, the method of manufacturing a semiconductor device additionally comprises, before the step of forming the aluminum alloy film, a step of forming a wiring line covering film above the aluminum film. The step of forming the wiring line covering film includes the step of forming the aluminum alloy film.

According to a preferred mode of the first aspect, in the step of forming the wiring line, the films from the aluminum film to the first titanium film are etched using the wiring line covering film as a mask.

According to a preferred mode of the first aspect, the method of manufacturing a semiconductor device additionally comprises, before the step of forming the wiring line, a step of forming an upper conductive film on the aluminum film, and a step of forming a resist pattern on the wiring line covering film. The wiring line covering film is formed on the upper conductive film. In the step of forming the wiring line covering film, a first covering film is shaped using the resist pattern as a mask.

According to a preferred mode of the first aspect, the aluminum diffusion-preventing film is a titanium nitride film having a thickness at most equal to 15 nm.

According to a preferred mode of the first aspect, the aluminum diffusion-preventing film is a titanium dioxide film having a thickness at most equal to 4 nm.

According to a preferred mode of the first aspect, in the step of forming the aluminum diffusion-preventing film, the titanium dioxide film is formed by air oxidation of the surface layer of the first titanium film.

According to a preferred mode of the first aspect, in the step of forming the aluminum diffusion-preventing film, the titanium dioxide film is formed by oxidizing the surface layer of the first titanium film by oxygen annealing.

According to a preferred mode of the first aspect, the electrically conductive plug contains tungsten.

According to a preferred mode of the first aspect, the method of manufacturing a semiconductor device additionally comprises, before the step of forming the electrically conductive plug, a step of planarizing the upper surface of the interlayer insulating film.

According to a preferred mode of the first aspect, in the step of forming the aluminum film, the aluminum film is formed by sputtering while maintaining the semiconductor substrate at a temperature of 300° C. or less.

According to a preferred mode of the second aspect, the aluminum diffusion-preventing film is a titanium nitride film having a thickness at most equal to 15 nm.

According to a preferred mode of the second aspect, the aluminum diffusion-preventing film is a titanium dioxide film having a thickness at most equal to 4 nm.

According to a preferred mode of the second aspect, the aluminum alloy film contains an alloy of aluminum and titanium.

According to a preferred mode of the second aspect, the electrically conductive plug contains tungsten.

According to a preferred mode of the second aspect, the wiring line additionally comprises a titanium nitride film on the aluminum film.

According to a preferred mode of the second aspect, the semiconductor device is additionally provided with a wiring line covering film on the wiring line.

In the following description, drawing reference codes are appended to aid understanding of the invention, and the present invention is not intended to be limited to the modes illustrated in the drawings. Ordinal numbers in the following description do not necessarily correspond to the ordinal numbers set forth in the scope of the patent claims.

Figure 2:
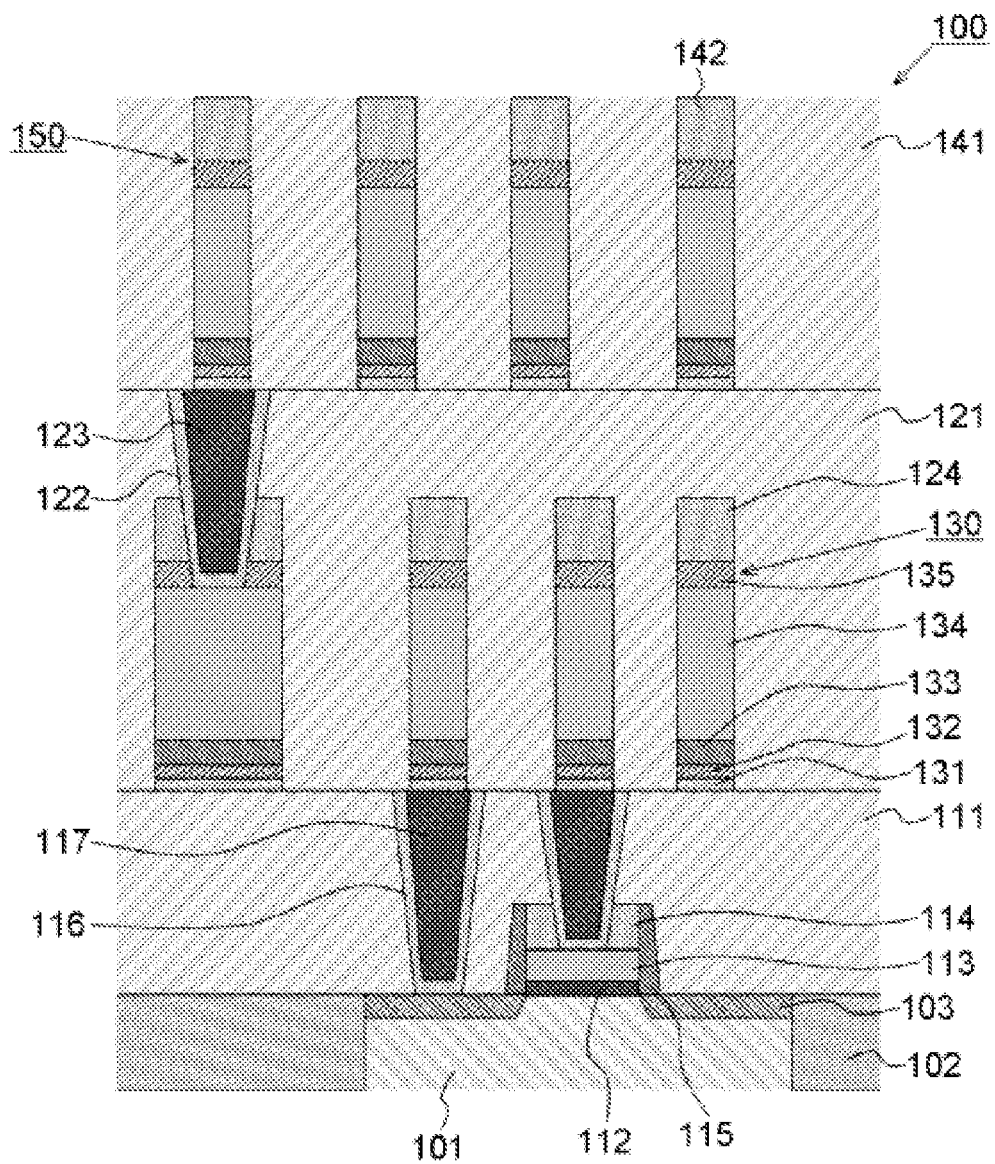
FIG. 2 is a schematic cross-sectional view of the semiconductor device through the line II-II in FIG. 1.

A semiconductor device according to a first mode of embodiment will be described. FIG. 1 is a schematic plan view of the semiconductor device according to the first mode of embodiment. FIG. 2 is a schematic cross-sectional view through the line II-II in FIG. 1. FIG. 1 is used to illustrate the positional relationships between each element, and only some of the elements illustrated in FIG. 2 are depicted. A DRAM (Dynamic Random Access Memory) can be cited as one example of a semiconductor device 100.

The semiconductor device 100 is provided with: a semiconductor substrate 101; element isolation regions 102 which are formed in the semiconductor substrate 101 and which demarcate an element-forming region; impurity-diffused regions 103 formed in the semiconductor substrate 101; a gate insulating film 112 formed on the semiconductor substrate 101; a gate electrode 113 formed on the gate insulating film 112; a gate covering layer 114 formed on the gate electrode 113; side walls 115 formed along the sidewalls of the gate electrode 113; first contact plugs 117 electrically connected to the impurity-diffused regions 103 and the gate electrode 113; and a first interlayer insulating film 111 formed on the semiconductor substrate 101, covering the gate electrode 113. The gate electrode 113, the gate insulating film 112 and the semiconductor substrate 101 having the impurity-diffused regions 103 form a transistor. The gate electrode 113 can be formed as a laminated body comprising a plurality of electrical conductors. The gate electrode 113 can, for example, comprise a polysilicon film, a tungsten silicide (WSi) film and a W film. The first contact plugs 117 may be covered by a first plug barrier film 116. The first contact plugs 117 can be formed, for example, from an electrical conductor such as W or molybdenum (Mo). The first plug barrier films 116 can be formed, for example, from a laminated body comprising a Ti film (lower layer) and a TiN film (upper layer). The semiconductor device 100 may also comprise capacitors (which are not shown in the drawings) and associated elements.

The semiconductor device 100 is additionally provided, on the first interlayer insulating film 111, with: first wiring lines 130; first wiring line covering films 124 formed on the first wiring lines 130; second contact plugs 123 electrically connected to the first wiring lines 130; and a second interlayer insulating film 121 covering the first wiring lines 130. Portions of the first wiring lines 130 are electrically connected to the first contact plugs 117. The second contact plugs 123 may be covered by a second plug barrier film 122. The second contact plugs 123 and the second plug barrier films 122 can be formed in the same way as the first contact plugs 117 and the first plug barrier films 116.

The first wiring lines 130 can be formed as laminated bodies comprising a plurality of electrical conductors. The first wiring lines 130 comprise, for example: a first barrier layer which prevents diffusion of aluminum; an aluminum alloy film 133 formed on the first barrier layer; an aluminum film 134 formed on the aluminum alloy film 133; and an upper conductive film 135 formed on the aluminum film 134. The aluminum alloy film 133 is, for example, an aluminum-titanium (Al—Ti) alloy film. The first barrier layers comprise first titanium films 131 in contact with the first contact plugs 117, and first aluminum diffusion-preventing films 132 formed on the first titanium films 131. The first aluminum diffusion-preventing films 132 in the first mode of embodiment are titanium nitride films. The upper conductive films 135 are, for example, titanium nitride films.

Figure 3:
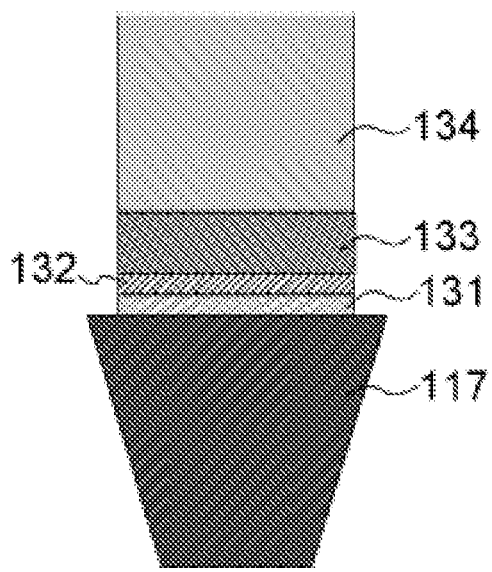
FIG. 3 is a schematic partial cross-sectional view of an aluminum alloy film and a first barrier layer in the first mode of embodiment.
Figure 4:
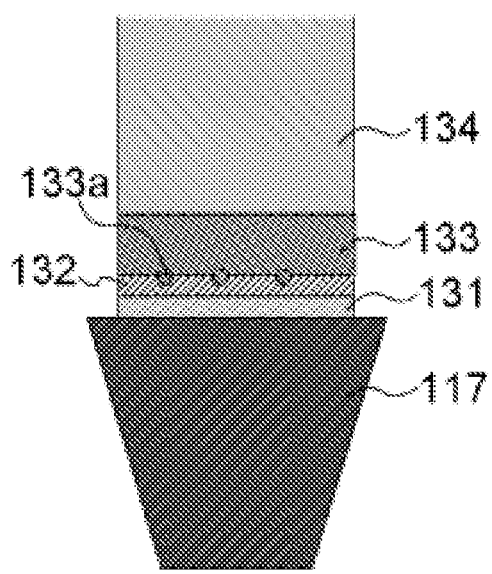
FIG. 4 is a schematic partial cross-sectional view of the aluminum alloy film and the first barrier layer in the first mode of embodiment.
Figure 5:
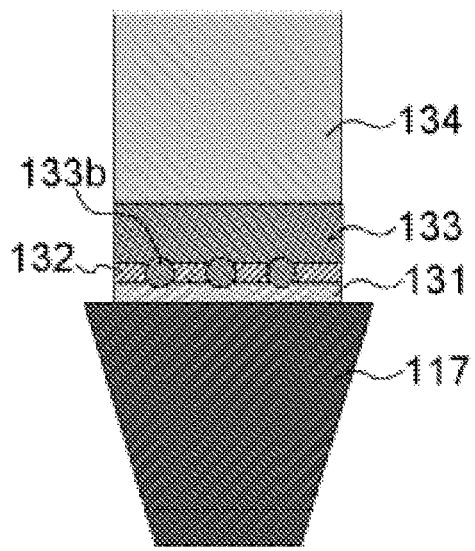
FIG. 5 is a schematic partial cross-sectional view of the aluminum alloy film and the first barrier layer in the first mode of embodiment.

FIG. 3 to FIG. 5 are schematic partial cross-sectional views of the aluminum alloy film 133 and the first barrier layer 131, 132. As illustrated in FIG. 3, the aluminum alloy film 133 is interposed between the first aluminum diffusion-preventing film 132 and the aluminum film 134. As illustrated in FIG. 4, parts (first parts 133a) of the aluminum alloy film 133 may be formed within portions of the first aluminum diffusion-preventing film 132. Further, as illustrated in FIG. 5, parts (second parts 133b) of the aluminum alloy film 133 may extend as far as portions of the upper layer of the first titanium film 131, penetrating through the first aluminum diffusion-preventing film 132. In order to prevent an increase in the contact resistance, the aluminum alloy film 133 is preferably not formed as far as the upper surface of the first contact plug 117.

The electrical connection between the first contact plug 117 and the first wiring line 130 is ensured by means of the contact between the first contact plug 117 and the first titanium film 131. It is thus possible to prevent an increase in the contact resistance between the first wiring line 130 and the first contact plug 117.

The thickness of the first titanium film 131 can be set to 20 nm, for example. If the first aluminum diffusion-preventing film 132 is titanium nitride, its thickness is preferably at most equal to 15 nm, more preferably at most equal to 10 nm, and still more preferably at least equal to 2 nm and at most equal to 10 nm. The respective thicknesses of the aluminum alloy film 133 and the aluminum film 134 are changed by means of an annealing process. The total thickness of the aluminum alloy film 133 and the aluminum film 134 can be set to 290 nm, for example (excluding the first parts 133a and the second parts 133b of the aluminum alloy film 133). The thickness of the upper conductive film 135 can be set to 50 nm, for example. The width of the first wiring line 130 can be set to at most 150 nm, for example.

The electrical connection between the second contact plug 123 and the first wiring line 130 is ensured by bringing the second contact plug 123 or the second plug barrier film 122 into contact with the aluminum film 134.

The semiconductor device 100 is additionally provided, on the second interlayer insulating film 121, with: second wiring lines 150; second wiring line covering films 142 formed on the second wiring lines 150; and a third interlayer insulating film 141 covering the second wiring lines 150. The second wiring lines 150 are electrically connected to the second contact plugs 123. The form of the second wiring lines 150 can be made to be the same as that of the first wiring lines 130. The semiconductor device 100 may be additionally provided with third contact plugs (which are not shown in the drawings), electrically connected to the second wiring lines 150.

The semiconductor device 100 may be additionally provided, on the third interlayer insulating film 141, with at least one interlayer insulating film and a wiring line. In the upper layer wiring lines, if the adverse effects of side etches are small, the form of the wiring lines may be different from the form of the first wiring lines 130. For example, wiring lines having a width exceeding 150 nm may be formed by successively laminating a titanium film, a titanium nitride film and an aluminum film.

A method of manufacturing the semiconductor device according to the first mode of embodiment will now be described. FIG. 6 to FIG. 14 are schematic process diagrams used to describe the method of manufacturing the semiconductor device according to the first mode of embodiment.

Figure 6:
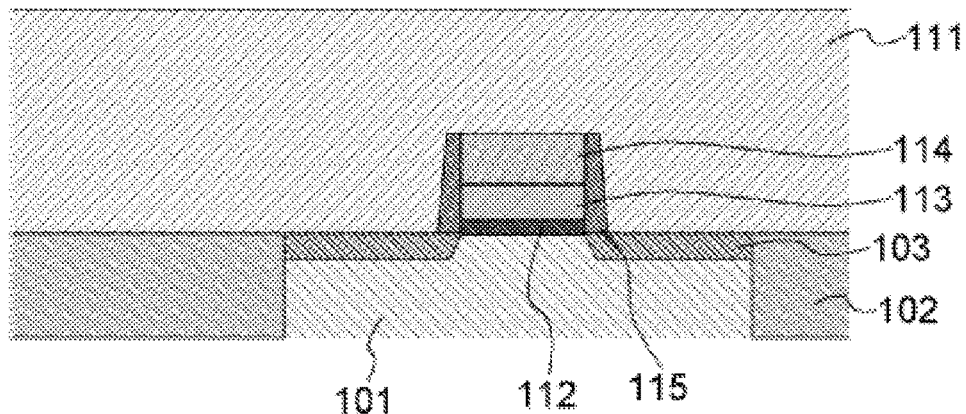
FIG. 6 is a schematic process diagram used to describe a method of manufacturing the semiconductor device according to the first mode of embodiment.

First, the elements below the second interlayer insulating film are formed. The first interlayer insulating film 111 is formed, after which the upper surface of the first interlayer insulating film 111 is planarized (FIG. 6). CMP (Chemical Mechanical Polishing) can, for example, be used as the planarizing process.

Figure 7:
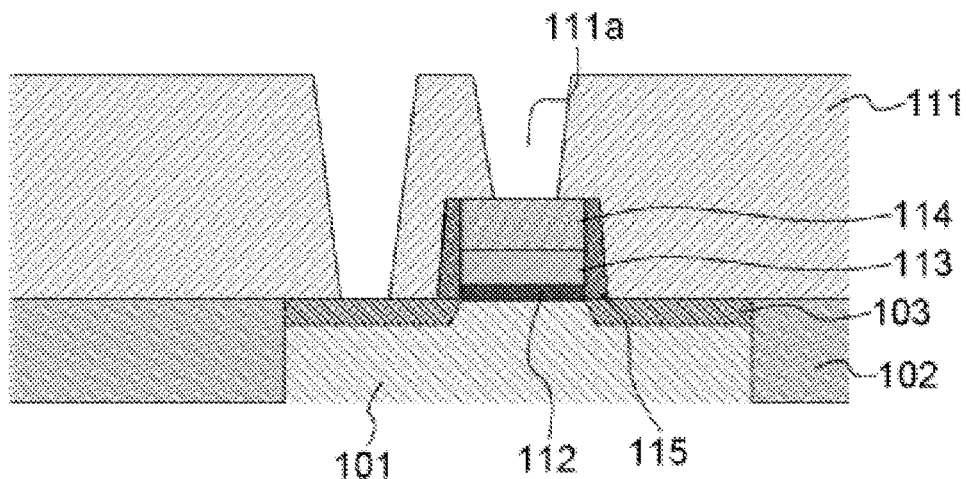
FIG. 7 is a schematic process diagram used to describe the method of manufacturing the semiconductor device according to the first mode of embodiment.

Through-holes 111a for embedding first contact plugs are then formed in the first interlayer insulating film 111 (FIG. 7). The through-holes 111a can, for example, be formed by dry etching.

Figure 8:
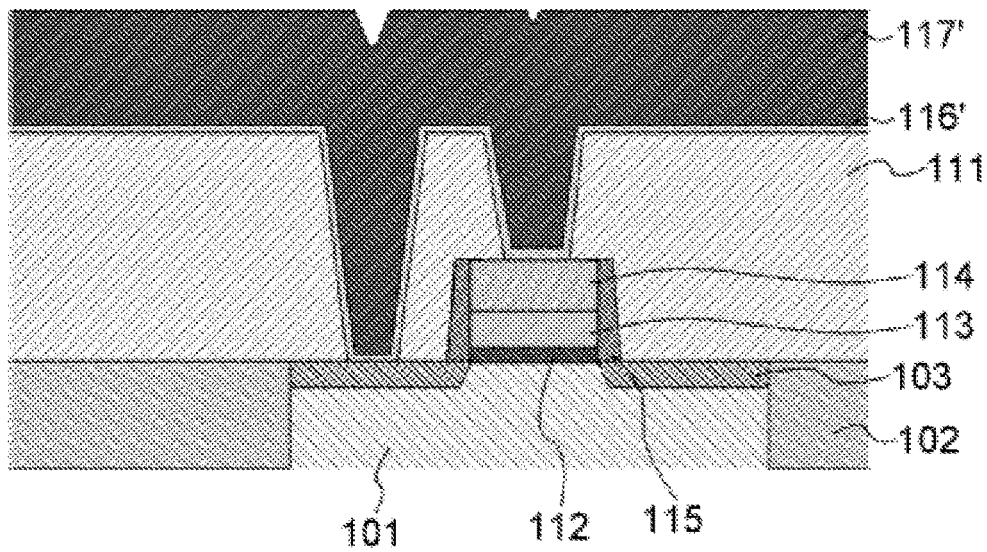
FIG. 8 is a schematic process diagram used to describe the method of manufacturing the semiconductor device according to the first mode of embodiment.

A first plug barrier film precursor film 116' is then formed in such a way as to cover the first interlayer insulating film 111, including the bottom surfaces and the inner walls of the through-holes 111a. The first plug barrier film precursor film 116' may be a laminated body comprising a titanium film and a titanium nitride film, or it may be a single film of titanium nitride. A first contact plug precursor film 117' is then formed on the first plug barrier film precursor film 116' (FIG. 8). The first plug barrier film precursor film 116' and the first contact plug precursor film 117' can be formed, for example, by CVD (Chemical Vapor Deposition).

Figure 9:
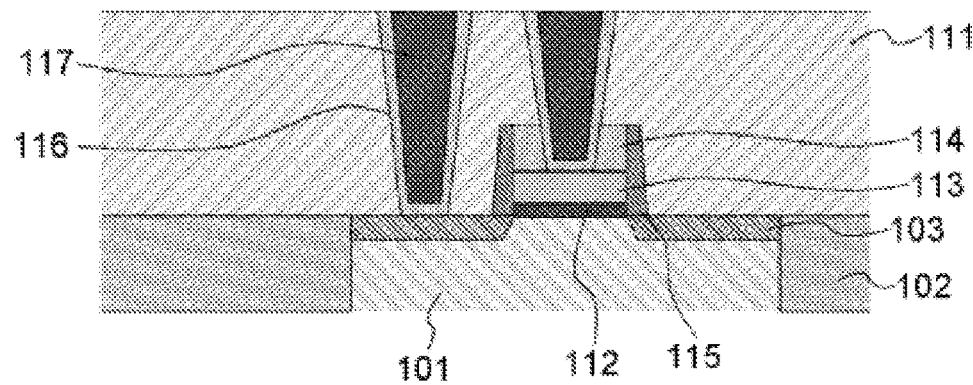
FIG. 9 is a schematic process diagram used to describe the method of manufacturing the semiconductor device according to the first mode of embodiment.

The first plug barrier film precursor film 116' and the first contact plug precursor film 117' on the upper surface of the first interlayer insulating film 111 are then removed to form first plug barrier films 116 and first contact plugs 117 (FIG. 9). The first plug barrier film precursor film 116' and the first contact plug precursor film 117 can, for example, be removed by CMP. The upper surfaces of the first plug barrier film precursor film 116' and the first contact plug precursor film 117' and the upper surface of the first interlayer insulating film 111 preferably form the same plane.

Figure 10:
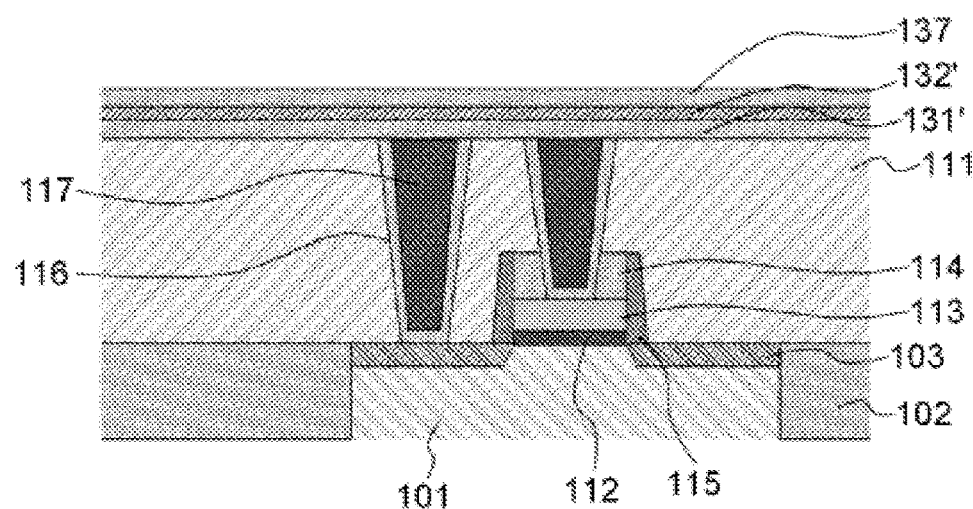
FIG. 10 is a schematic process diagram used to describe the method of manufacturing the semiconductor device according to the first mode of embodiment.

A first titanium film precursor film 131', which is a titanium film, is then formed on the first interlayer insulating film 111. The thickness of the first titanium film precursor film 131' can be set to 20 nm, for example. A first aluminum diffusion-preventing film precursor film 132' is then formed on the first titanium film precursor film 131'. In the first mode of embodiment, the first aluminum diffusion-preventing film precursor film 132' is a titanium nitride film. The thickness of the first aluminum diffusion-preventing film precursor film 132' can be set, for example, to 15 nm or less, preferably 10 nm or less, and more preferably between 2 nm and 10 nm. A second titanium film 137 is then formed on the first aluminum diffusion-preventing film precursor film 132' (FIG. 10). The thickness of the second titanium film 137 can be set to 20 nm, for example. The first titanium film precursor film 131', the first aluminum diffusion-preventing film precursor film 132' and the second titanium film 137 can be formed by sputtering, for example.

Figure 11:
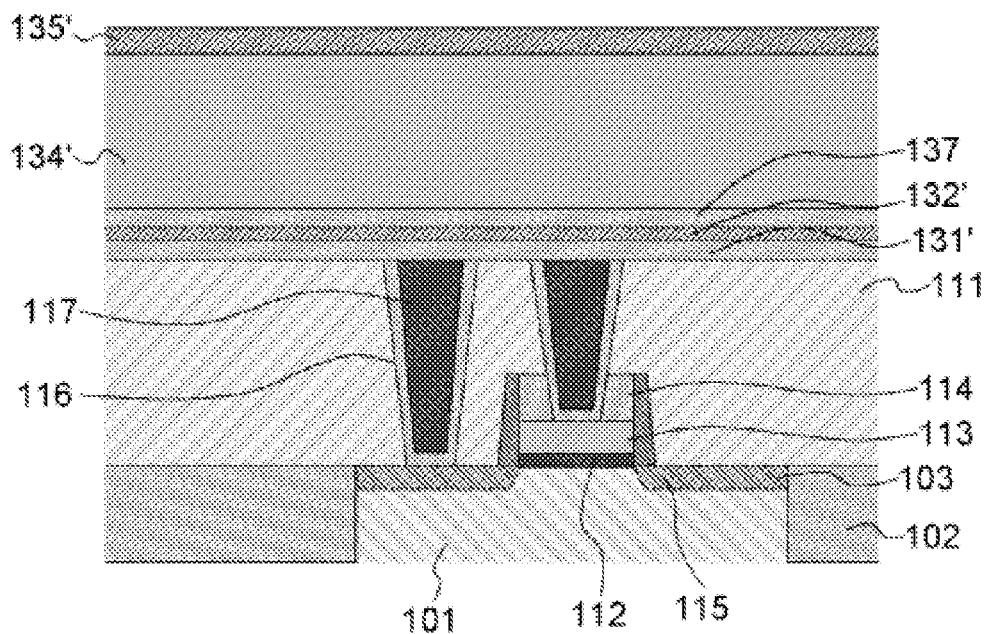
FIG. 11 is a schematic process diagram used to describe the method of manufacturing the semiconductor device according to the first mode of embodiment.

An aluminum film precursor film 134', which is an aluminum film, is then formed on the second titanium film 137. The thickness of the aluminum film precursor film 134' can be set to 270 nm, for example. The aluminum film precursor film 134' can be formed by sputtering, for example. At this time, in order to increase the machining accuracy, the aluminum film precursor film 134' is preferably formed under temperature conditions of 250° C. or less. Further, the thickness of the aluminum film precursor film 134' must be at least three times the thickness of the second titanium film 137 to prevent the entire aluminum film precursor film 134' becoming an aluminum-titanium alloy during annealing, discussed hereinafter. An upper conductive film precursor film 135', which is a titanium nitride film, for example, is then formed on the aluminum film precursor film 134' (FIG. 11). The upper conductive film precursor film 135' also fulfills the role of an antireflective film when a resist for processing the laminated body is being formed.

Figure 12:
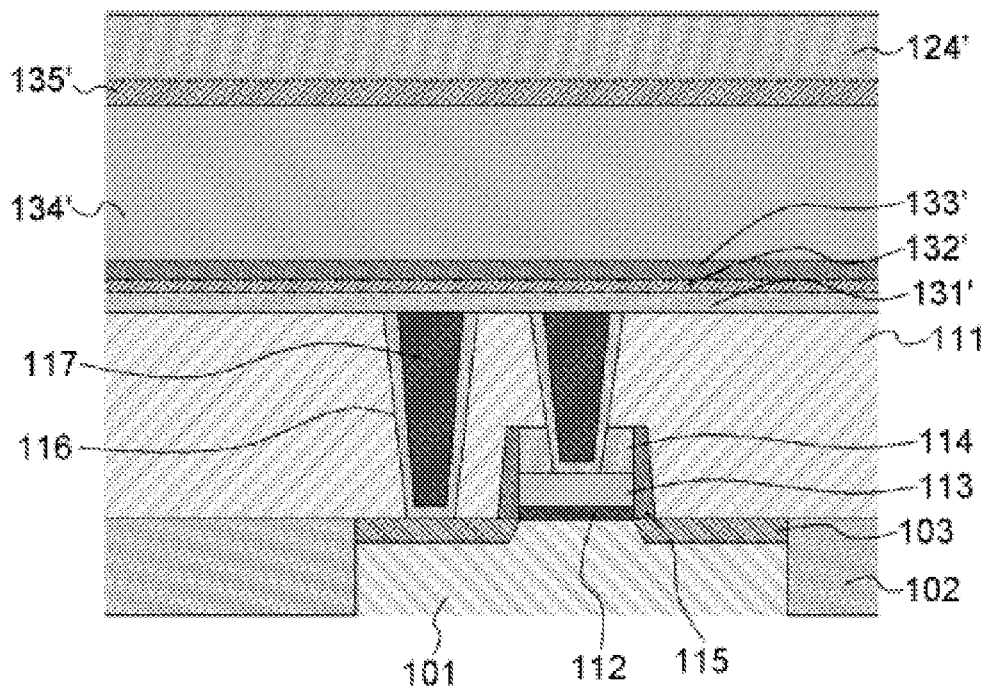
FIG. 12 is a schematic process diagram used to describe the method of manufacturing the semiconductor device according to the first mode of embodiment.

A first wiring line covering film precursor film 124' is then formed on the upper conductive film precursor film 135'. The first wiring line covering film precursor film 124' fulfills the role of a hardmask for processing the laminated body. The first wiring line covering film precursor film 124' can, for example, be formed from a silicon dioxide film. The silicon dioxide film can be grown using plasma technology, for example. In this case, the silicon dioxide film is formed in an environment at a temperature of at least 400° C. The aluminum film precursor film 134' and the second titanium film 137 are therefore also subjected to heat treatment, and alloying progresses. To elaborate, at least a portion of the second titanium film 137 (preferably the entire film) and a lower portion of the aluminum film precursor film 134' react to form an aluminum alloy film precursor film 133', which is an aluminum-titanium alloy (FIG. 12). At this time, the first aluminum diffusion-preventing film precursor film 132' functions as a film preventing diffusion of aluminum in the aluminum film precursor film 134' toward the first contact plugs 117. Further, the second titanium film 137 functions as a buffer film weakening the vigor with which aluminum in the aluminum film precursor film 134' diffuses toward the first contact plugs 117. To elaborate, the presence of the second titanium film 137 and the first aluminum diffusion-preventing film precursor film 132' below the aluminum film precursor film 134' suppresses alloying of the first titanium film precursor film 131' and the aluminum film precursor film 134', making it possible for the first titanium film precursor film 131' to be left on the first contact plugs 117. It is thus possible to prevent an increase in the contact resistance between the first wiring lines 130 and the first contact plugs 117.

If the temperature when the first wiring line covering film precursor film 124' is formed is less than 400° C., then in order to reduce the contact resistance between the first wiring lines 130 and the first contact plugs 117, the aluminum alloy film precursor film 133' may be formed by carrying out annealing after the first wiring line covering film precursor film 124' has been formed. The annealing conditions can, for example, be set to a temperature of between 400° C. and 450° C., a pressure of between 6 Torr and 8 Torr ($8\times10^2$ Pa to $1\times10^3$ Pa), in an argon gas atmosphere for 30 seconds.

Figure 13:
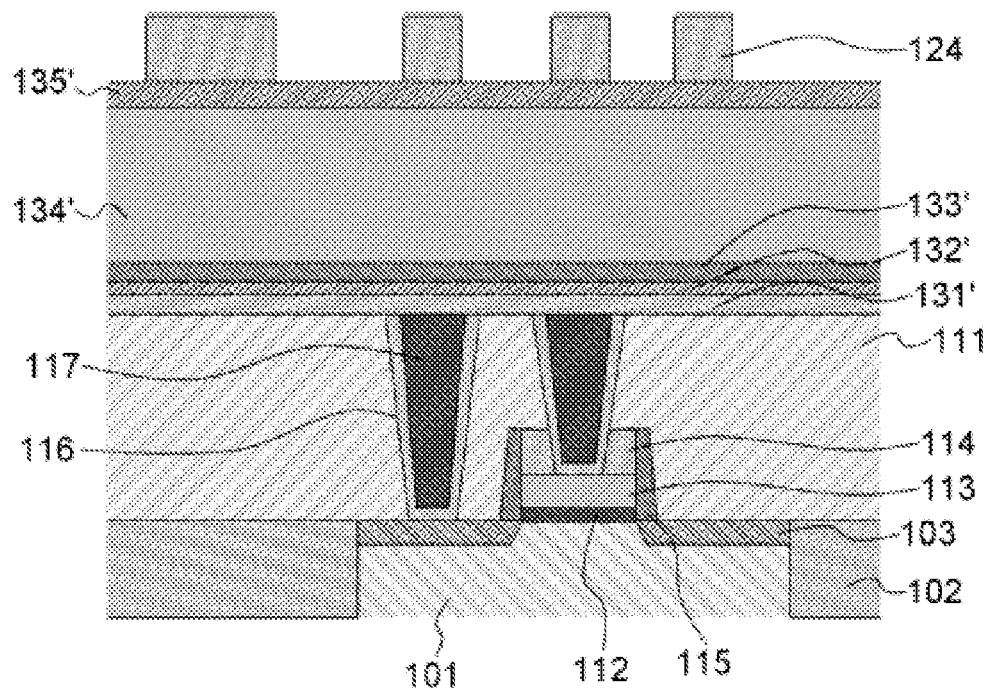
FIG. 13 is a schematic process diagram used to describe the method of manufacturing the semiconductor device according to the first mode of embodiment.

A resist (which is not shown in the drawings) having a pattern of the first wiring lines 130 is then formed on the first wiring line covering film precursor film 124'. A chemically amplified resist can be used for the resist. In this case, if the wiring line width is 65 nm or greater, a KrF exposure machine can be used, and if it is less than 65 nm, an ArF exposure machine can be used. A first wiring line covering film 124 having the pattern of the first wiring lines 130 is then formed by dry etching the first wiring line covering film precursor film 124' (FIG. 13).

Figure 14:
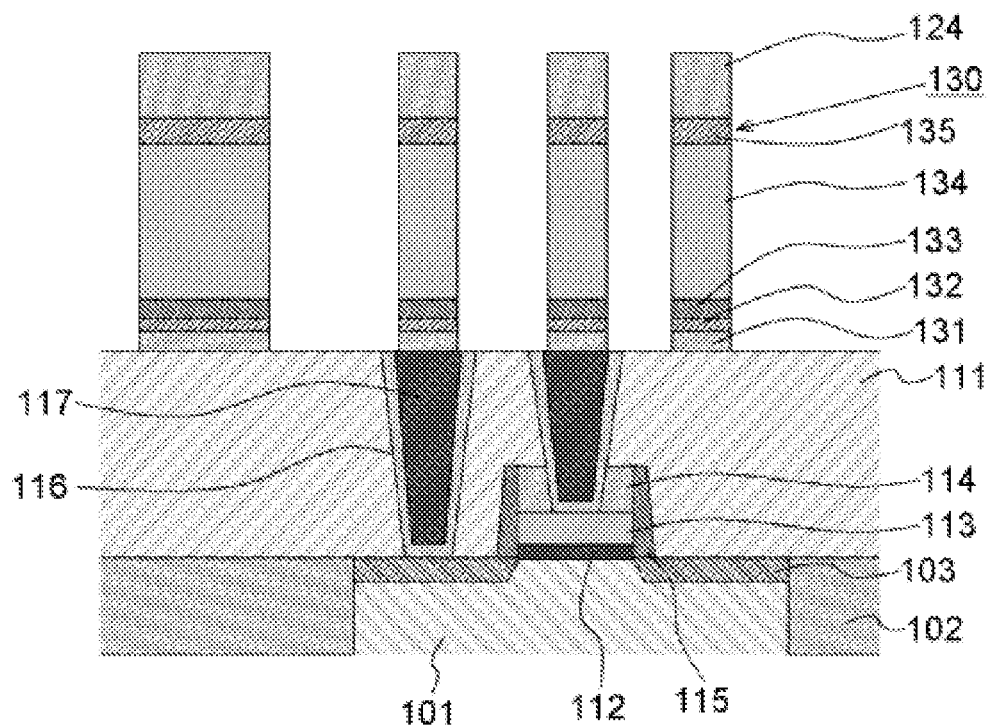
FIG. 14 is a schematic process diagram used to describe the method of manufacturing the semiconductor device according to the first mode of embodiment.

The laminated body is then shaped by dry etching using the first wiring line covering film 124 as a mask, to form upper conductive films 135, aluminum films 134, aluminum alloy films 133, first aluminum diffusion-preventing films 132 and first titanium films 131. In other words, the first wiring lines 130 are formed (FIG. 14). At this time, forming a titanium nitride film below the aluminum alloy film 133, in other words as the first aluminum diffusion-preventing film 132, and setting the thickness of the titanium nitride film to 15 nm or less, eliminates the risk of side etches being formed in the aluminum alloy films 133 and the aluminum films 134 when the first aluminum diffusion-preventing film 132 is being etched. To elaborate, the thickness of the titanium nitride film, which is the first aluminum diffusion-preventing film 132, is set to a thickness whereby the titanium nitride film etching time is short, deposits on the sidewalls of the aluminum alloy films 133 and the aluminum films 134 are not completely removed, and side etching does not progress. Further, if the aluminum diffusion-preventing film 132 is made thinner, there is a risk that aluminum-titanium alloying will occur as far as the first titanium film 131, but inserting the second titanium film 137 on the first aluminum diffusion-preventing film 132 stops vigorous alloying, thereby preventing the alloying from reaching as far as the lower portion of the first titanium film 131. In this way, in addition to preventing side etching, the problem of the first titanium film 131 becoming alloyed can also be eliminated, making it possible to improve the product yield and to extend the operating life of the product.

A second interlayer insulating film 121 (which is not shown in the drawings) is then formed in such a way as to cover the first wiring lines 130. Various elements are then formed in the same way on the second interlayer insulating film 121, thereby completing the manufacture of the semiconductor device 100 (FIG. 2).

Figure 15:
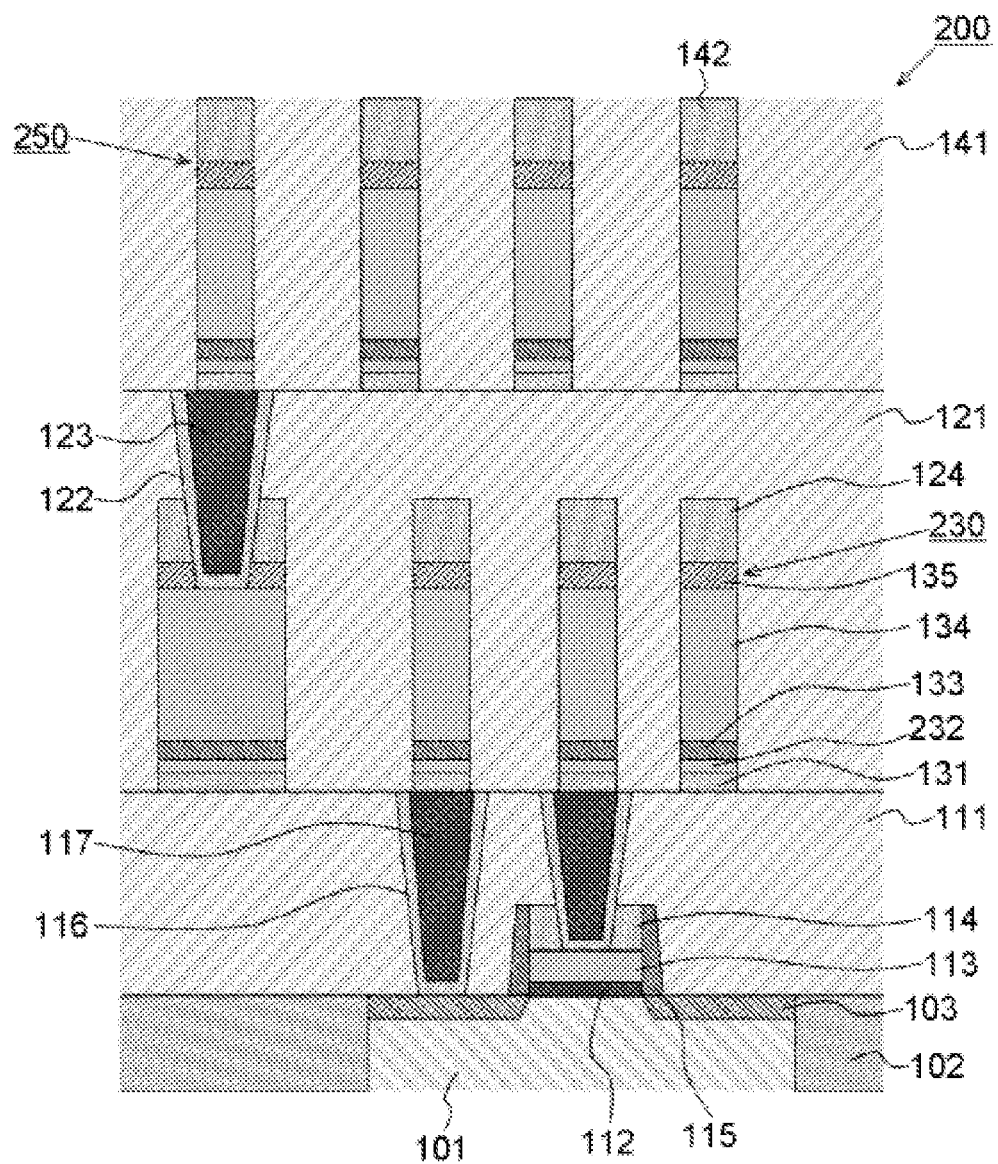
FIG. 15 is a schematic cross-sectional view of a semiconductor device according to a second mode of embodiment.

A semiconductor device according to a second mode of embodiment will now be described. FIG. 15 is a schematic cross-sectional view of the semiconductor device according to the second mode of embodiment. In FIG. 15, the same reference codes refer to elements that are the same as in the first mode of embodiment.

In a semiconductor device 200, third wiring lines 230 comprise a second barrier layer, an aluminum alloy film 133, an aluminum film 134 and an upper conductive film 135. The second barrier layer comprises a first titanium film 131 and a second aluminum diffusion-preventing film 232. In the first mode of embodiment, the first aluminum diffusion-preventing film comprises titanium nitride, but in the second mode of embodiment, the second aluminum diffusion-preventing film 232 comprises titanium dioxide ($TiO_2$). The thickness of the second aluminum diffusion-preventing film 232 is preferably 4 nm or less, and more preferably between 1 nm and 3 nm.

Figure 16:
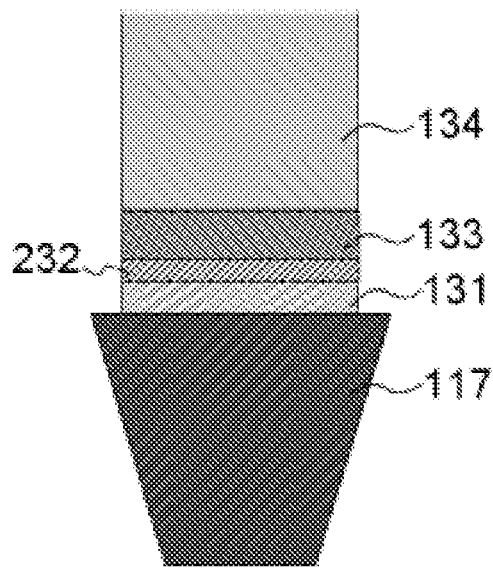
FIG. 16 is a schematic partial cross-sectional view of an aluminum alloy film and a second barrier layer in the second mode of embodiment.
Figure 17:
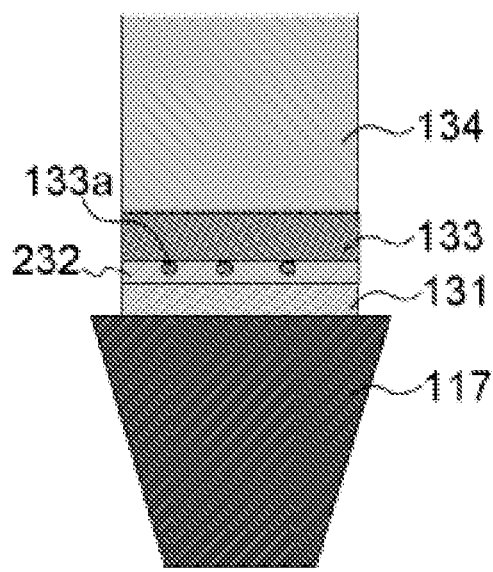
FIG. 17 is a schematic partial cross-sectional view of the aluminum alloy film and the second barrier layer in the second mode of embodiment.
Figure 18:
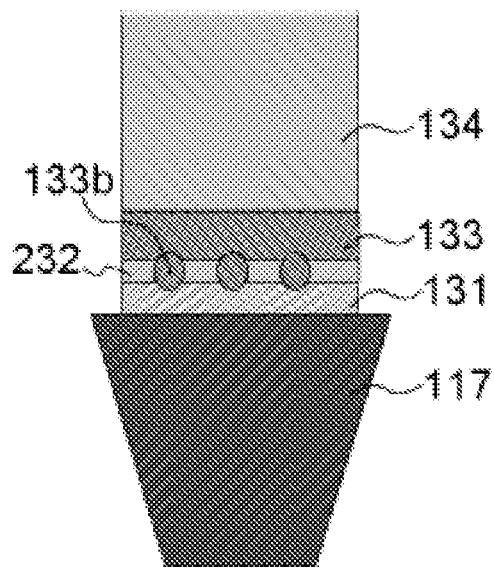
FIG. 18 is a schematic partial cross-sectional view of the aluminum alloy film and the second barrier layer in the second mode of embodiment.

FIG. 16 to FIG. 18 are schematic partial cross-sectional views of the aluminum alloy film 133 and the second barrier layer 131, 232. As illustrated in FIG. 16, the aluminum alloy film 133 is interposed between the second aluminum diffusion-preventing film 232 and the aluminum film 134. As illustrated in FIG. 17, parts (first parts 133a) of the aluminum alloy film 133 may be formed within portions of the second aluminum diffusion-preventing film 232. Further, as illustrated in FIG. 18, parts (second parts 133b) of the aluminum alloy film 133 may extend as far as portions of the upper layer of the first titanium film 131, penetrating through the second aluminum diffusion-preventing film 232. In order to prevent an increase in the contact resistance, the aluminum alloy film 133 is preferably not formed as far as the upper surface of the first contact plug 117.

Figure 19:
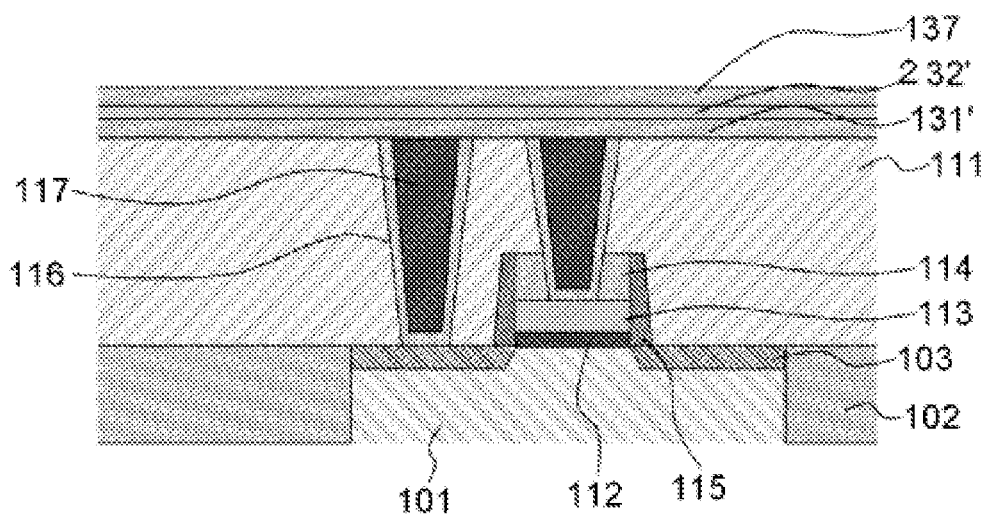
FIG. 19 is a schematic process diagram used to describe a method of manufacturing the semiconductor device according to the second mode of embodiment.
Figure 20:
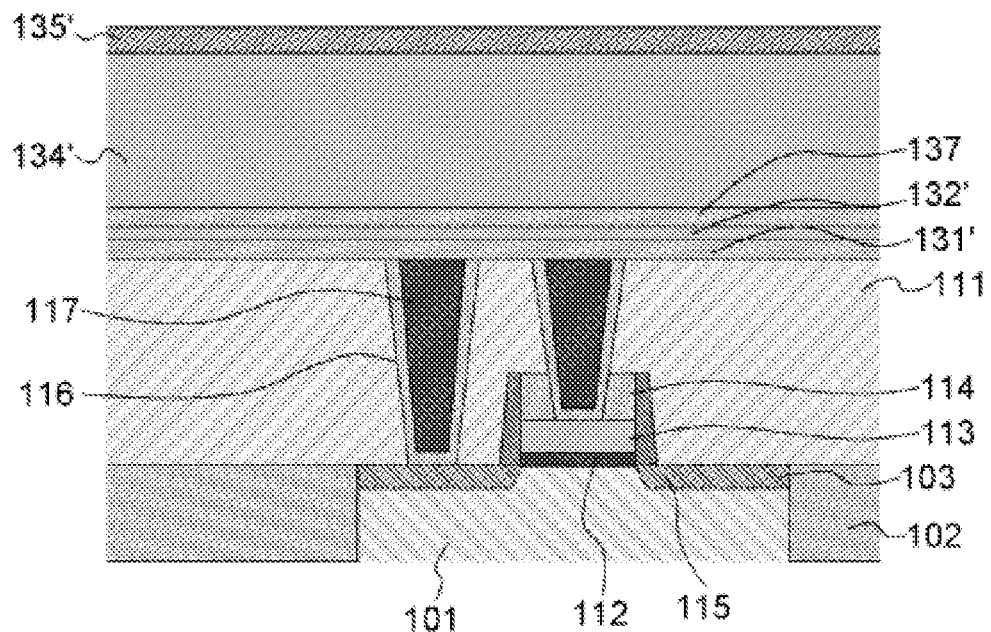
FIG. 20 is a schematic process diagram used to describe the method of manufacturing the semiconductor device according to the second mode of embodiment.
Figure 21:
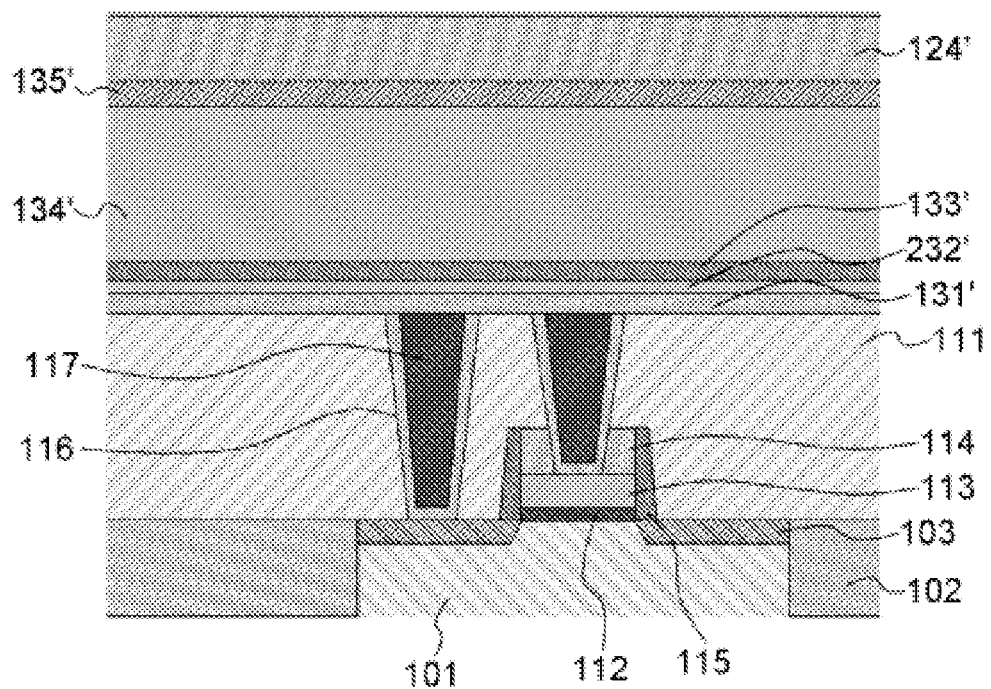
FIG. 21 is a schematic process diagram used to describe the method of manufacturing the semiconductor device according to the second mode of embodiment.

A method of manufacturing the semiconductor device according to the second mode of embodiment will now be described. FIG. 19 to FIG. 21 are schematic process diagrams used to describe the method of manufacturing the semiconductor device according to the second mode of embodiment.

The manufacturing method is the same as in the first mode of embodiment as far as the steps illustrated in FIG. 6 to FIG. 9. A first titanium film precursor film 131', which is a titanium film, is then formed on the first interlayer insulating film 111. The thickness of the first titanium film precursor film 131' can be set to 20 nm, for example. A second aluminum diffusion-preventing film precursor film 232', which is a titanium dioxide film, is then formed by oxidizing the upper surface of the first titanium film precursor film 131'. If the upper surface of the first titanium film precursor film 131' is air-oxidized, the second aluminum diffusion-preventing film precursor film 232' can be formed to a thickness of 1 nm. Further, the second aluminum diffusion-preventing film precursor film 232' can be formed to a thickness of 2 nm by performing an annealing process for 60 seconds at 250° C. using oxygen gas diluted with argon gas, for example. A second titanium film 137 is then formed on the second aluminum diffusion-preventing film precursor film 232' (FIG. 19). The thickness of the second titanium film 137 can be set to 20 nm, for example.

In the same way as in the first mode of embodiment, an aluminum film precursor film 134' and an upper conductive film precursor film 135' are then formed on the second titanium film 137 (FIG. 20). The thickness of the aluminum film precursor film 134' must be at least three times the thickness of the second titanium film 137 to prevent the entire aluminum film precursor film 134' becoming an aluminum-titanium alloy during annealing, discussed hereinafter.

In the same way as in the first mode of embodiment, a first wiring line covering film precursor 124' is then formed on the upper conductive film precursor film 135'. The second titanium film 137 and a lower portion of the aluminum film precursor film 134' are then caused to react by being heat-treated, to form an aluminum alloy film precursor film 133' (FIG. 21). At this time, the second aluminum diffusion-preventing film precursor film 232' functions in the same way as the first aluminum diffusion-preventing film precursor film 132' in the first mode of embodiment, preventing diffusion of aluminum in the aluminum film precursor film 134' toward the first contact plugs 117. By this means, the first titanium film precursor film 131' can be made to remain on the first contact plugs 117, and it thus possible to prevent an increase in the contact resistance between the third wiring lines 230 and the first contact plugs 117. Further, in the second mode of embodiment a titanium nitride film is not present below the aluminum film 134, and therefore side etching is not a concern.

The subsequent steps are the same as the steps illustrated in FIG. 13 and FIG. 14.

Modes of the second mode of embodiment other than those described above are the same as in the first mode of embodiment.

Figure 22:
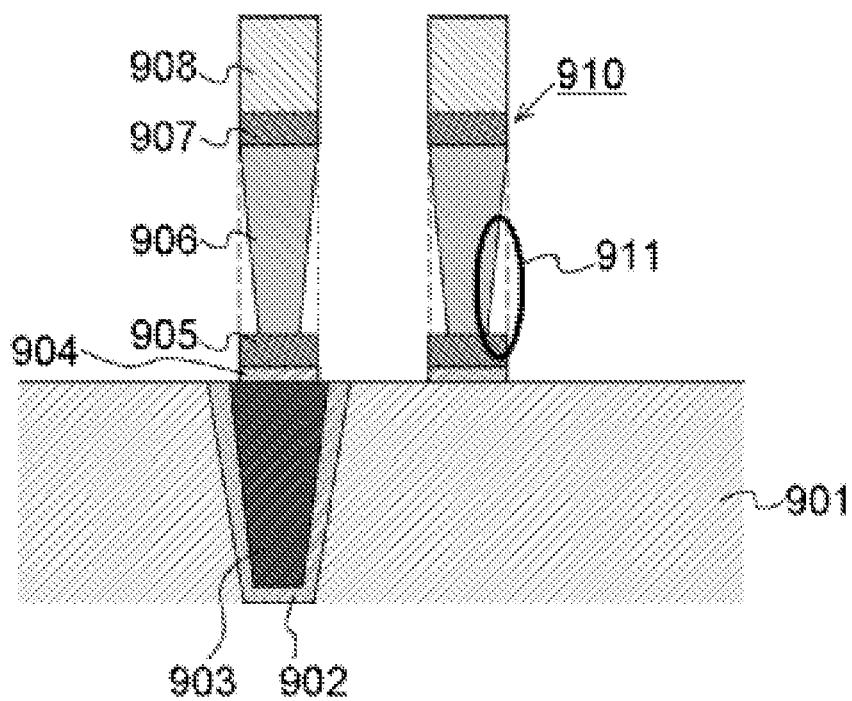
FIG. 22 is a schematic cross-sectional view of a process to form an aluminum wiring line according to the background art.
Figure 23:
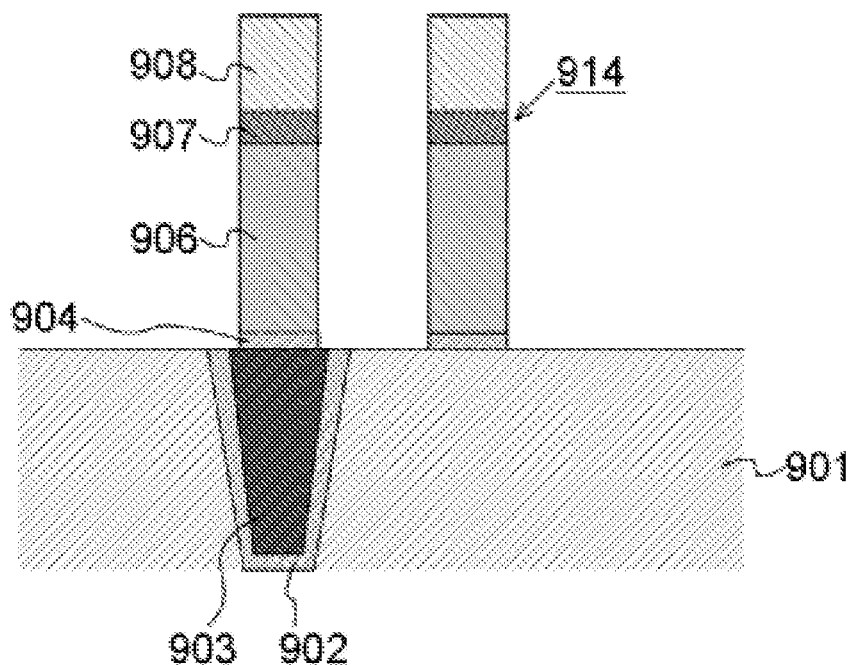
FIG. 23 is a schematic cross-sectional view of a semiconductor device used to describe the problems to be resolved by the present invention.
Figure 24:
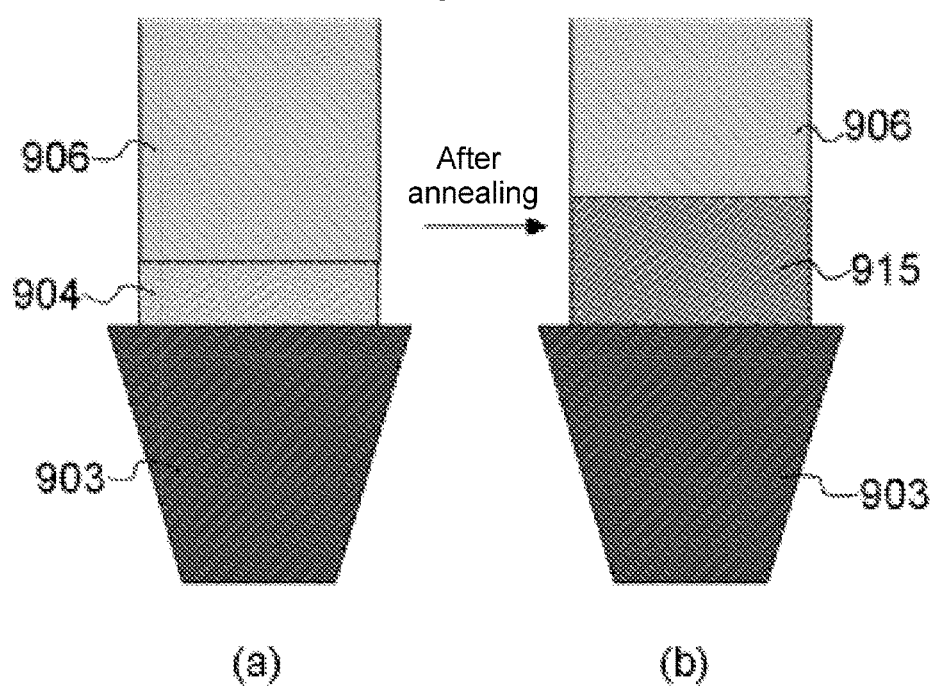
FIG. 24 is an enlarged view of the titanium film part in FIG. 23.

A comparative example will now be described. The inventor found that side etches 911 such as those illustrated in FIG. 22 are generated at the interface between the aluminum film 906 and the titanium nitride film 905. Accordingly, the inventor attempted to fabricate an aluminum wiring line 914 in which a single-layer titanium film 904 is used as a barrier film, as illustrated in FIG. 23. This suppressed the generation of side etches. However, another problem arose as a result of the fact that no titanium nitride film was present. FIG. 24 is an enlarged view of the titanium film 904 part in FIG. 23. When annealing is carried out during formation of the wiring lines, the titanium film 904 and a lower portion of the aluminum film 906 become alloyed, forming an aluminum-titanium alloy 915. Then, if the titanium film 904 is thin, the aluminum-titanium alloy 915 reaches the upper surface of the contact plug 903. In this case, a titanium film 904 such as that illustrated in FIG. 23 is not present, and the aluminum-titanium alloy 915 is in direct contact with the contact plug 903. The contact resistance with the contact plug 903 therefore increases. Meanwhile, if the titanium film 904 is made thicker, then even if it is possible to prevent the aluminum-titanium alloy 915 being formed as far as the upper surface of the contact plug 903, the resistance of the aluminum wiring line 914 itself increases. It can therefore be seen that the first mode of embodiment and the second mode of embodiment are effective in suppressing the generation of side etches, suppressing an increase in the contact resistance with the contact plugs, and suppressing an increase in the resistance of the wiring lines themselves.

The semiconductor device and the method of manufacturing a semiconductor device according to the present invention have been described on the basis of the abovementioned modes of embodiment, but it goes without saying that various modifications, variations and improvements to the various disclosed elements (including for example each element of each claim, each element of each mode of embodiment or example, and each element of each drawing) can be included within the scope of the present invention and on the basis of the basic technical concept of the present invention, without limitation to the abovementioned modes of embodiment. Further, various combinations of, substitutions of, or selections from the various disclosed elements (including for example each element of each claim, each element of each mode of embodiment or example, and each element of each drawing) are possible within the framework of the scope of the claims in the present invention.

Additional challenges, objectives and modes of deployment relating to the present invention will be clear from the entire disclosure of the present invention, including the scope of the claims.

With regard to ranges of numerical values set forth herein, arbitrary numerical values or sub-ranges contained within said ranges should be interpreted as being specifically set forth, even if not otherwise set forth.

EXPLANATION OF THE REFERENCE NUMBERS 100, 200 Semiconductor device
101 Semiconductor substrate
102 Element isolation region
103 Impurity-diffused region
111 First interlayer insulating film
111a Through-hole
112 Gate insulating film
113 Gate electrode
114 Gate covering layer
115 Side wall
116 First plug barrier film
116' First plug barrier film precursor film
117 First contact plug
117' First contact plug precursor film
121 Second interlayer insulating film
122 Second plug barrier film
123 Second contact plug
124 First wiring line covering film
124' First wiring line covering film precursor film
130 First wiring line
131 First titanium film
131' First titanium film precursor film
132 First aluminum diffusion-preventing film
132' First aluminum diffusion-preventing film precursor film
133 Aluminum alloy film
133a First part
133b Second part
133' Aluminum alloy film precursor film
134 Aluminum film
134' Aluminum film precursor film
135 Upper conductive film
135' Upper conductive film precursor film
137 Second titanium film
141 Third interlayer insulating film
142 Second wiring line covering film
150 Second wiring line
230 Third wiring line
232 Second aluminum diffusion-preventing film
232' Second aluminum diffusion-preventing film precursor film
901 Interlayer insulating film
902 Barrier film
903 Contact plug
904 Titanium film
905 Titanium nitride film
906 Aluminum film
907 Titanium nitride film
908 Mask
910 Aluminum wiring line
911 Side etch
914 Aluminum wiring line
915 Aluminum-titanium alloy

What is claimed is:

1. A method of manufacturing a semiconductor device, comprising:
    forming an interlayer insulating film above a semiconductor substrate;
    forming in the interlayer insulating film an electrically conductive plug, the upper surface of which forms the same plane as the upper surface of the interlayer insulating film such that the interlayer insulating film is planarized;
    forming a first titanium film directly on the interlayer insulating film and directly on the electrically conductive plug;
    forming an aluminum diffusion-preventing film on the first titanium film;
    forming a second titanium film on the aluminum diffusion-preventing film;
    forming an aluminum film on the second titanium film; and
    forming a wiring line by employing etching to shape the aluminum film, the second titanium film, the aluminum diffusion-preventing film, and the first titanium film so that in a cross-section including a bottom surface of the first titanium film, the bottom surface of the first titanium film that contacts the electrically conductive plug only contacts the electrically conductive plug.

2. The method of claim 1, comprising, before forming the wiring line, forming an aluminum alloy film by causing at least a portion of the second titanium film to react with a portion of the aluminum film.

3. The method of claim 2, wherein forming the aluminum alloy film comprises forming the aluminum alloy film by heating the semiconductor substrate to 400° C. to 450° C.

4. The method of claim 2, comprising, before forming the aluminum alloy film, forming a wiring line covering film above the aluminum film.

5. The method of claim 4, wherein forming the wiring line comprises etching the films from the aluminum film to the first titanium film using the wiring line covering film as a mask.

6. The method of claim 5, comprising, before forming the wiring line, forming an upper conductive film on the aluminum film, and forming a resist pattern on the wiring line covering film, wherein the wiring line covering film is formed on the upper conductive film, and forming the wiring line covering film comprises shaping a first covering film using the resist pattern as a mask.

7. The method of claim 1, wherein the aluminum diffusion-preventing film is a titanium nitride film having a thickness at most equal to 15 nm.

8. The method of claim 1, wherein the aluminum diffusion-preventing film is a titanium dioxide film having a thickness at most equal to 4 nm.

9. The method of claim 8, wherein forming the aluminum diffusion-preventing film comprises forming the titanium dioxide film by air oxidation of the surface layer of the first titanium film.

10. The method of claim 8, wherein forming the aluminum diffusion-preventing film comprises forming the titanium dioxide film by oxidizing the surface layer of the first titanium film by oxygen annealing.

11. The method of claim 1, wherein the electrically conductive plug contains tungsten.

12. The method of claim 1, wherein, before forming the electrically conductive plug, planarizing the upper surface of the interlayer insulating film.

13. The method of claim 1, wherein forming the aluminum film comprises forming the aluminum film by sputtering while maintaining the semiconductor substrate at a temperature of 300° C. or less.

14. A semiconductor device comprising:
    a semiconductor substrate;
    an interlayer insulating film formed above the semiconductor substrate;
    an electrically conductive plug which is formed in the interlayer insulating film, and the upper surface of which forms the same plane as the upper surface of the interlayer insulating film; and
    on the interlayer insulating film, a wiring line which is electrically connected to the electrically conductive plug; wherein the wiring line comprises:
        a titanium film in contact with the electrically conductive plug so that in a cross-section including a bottom surface of the titanium film, the bottom surface of the titanium film that contacts the electrically conductive plug only contacts the electrically conductive plug;
        an aluminum diffusion-preventing film coplanar with the titanium film and formed on the titanium film;
        an aluminum alloy film coplanar with the aluminum diffusion-preventing film and formed on the aluminum diffusion-preventing film; and
        an aluminum film coplanar with the aluminum alloy film and formed on the aluminum alloy film.

15. The semiconductor device of claim 14, wherein the aluminum diffusion-preventing film is a titanium nitride film having a thickness at most equal to 15 nm.

16. The semiconductor device of claim 14, wherein the aluminum diffusion-preventing film is a titanium dioxide film having a thickness at most equal to 4 nm.

17. The semiconductor device of claim 14, wherein the aluminum alloy film contains an alloy of aluminum and titanium.

18. The semiconductor device of claim 14, wherein the electrically conductive plug contains tungsten.

19. The semiconductor device of claim 14, wherein the wiring line additionally comprises a titanium nitride film on the aluminum film.

20. The semiconductor device of claim 14, comprising a wiring line covering film on the wiring line.

* * * * *